(12) United States Patent
Shin et al.

(10) Patent No.: US 9,076,895 B2
(45) Date of Patent: Jul. 7, 2015

(54) STEREOSCOPIC IMAGE DISPLAY SUBSTRATE

(71) Applicant: Samsung Display Co., Ltd., Yongin-si (KR)

(72) Inventors: Yong-Hwan Shin, Yongin-si (KR); Baek-Kyun Jeon, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 274 days.

(21) Appl. No.: 13/674,657

(22) Filed: Nov. 12, 2012

(65) Prior Publication Data
US 2013/0168680 A1    Jul. 4, 2013

(30) Foreign Application Priority Data

Dec. 28, 2011    (KR) .......................... 10-2011-0144666

(51) Int. Cl.
| | | |
|---|---|---|
| *H01L 29/04* | (2006.01) | |
| *H01L 33/00* | (2010.01) | |
| *H01L 33/08* | (2010.01) | |
| *H04N 13/04* | (2006.01) | |
| *H01L 27/12* | (2006.01) | |
| *G02F 1/1343* | (2006.01) | |
| *G02B 27/26* | (2006.01) | |

(52) U.S. Cl.
CPC ............ *H01L 33/0041* (2013.01); *H01L 33/08* (2013.01); *H01L 27/1214* (2013.01); *H04N 13/0434* (2013.01); *G02F 2001/134345* (2013.01); *G02B 27/26* (2013.01)

(58) Field of Classification Search
None
See application file for complete search history.

*Primary Examiner* — Marvin Payen
(74) *Attorney, Agent, or Firm* — H.C. Park & Associates, PLC

(57) ABSTRACT

A stereoscopic image display substrate includes a base substrate, a data line, a plurality of gate line parts and a pixel electrode part. The data line is disposed on the base substrate. The data line extends in a first direction. The gate line parts are disposed on the base substrate. Each gate line part includes a plurality of gate lines extending in a second direction different from the first direction. The gate lines are adjacent to each other. The pixel electrode part is disposed between the gate line parts. The pixel electrode part includes at least three pixel electrodes connected to the data line.

21 Claims, 9 Drawing Sheets

STEREOSCOPIC IMAGE DISPLAY SUBSTRATE

CROSS-REFERENCE TO RELATED APPLICATION

This application claims priority from and the benefit of Korean Patent Application No. 10-2011-0144666, filed on Dec. 28, 2011, the contents of which are incorporated by reference herein in its entirety.

BACKGROUND

1. Field

The following disclosure relates to a stereoscopic image display substrate, a stereoscopic image display panel having the stereoscopic image display substrate, and a stereoscopic system having the stereoscopic image display substrate. More particularly, the following disclosure relates to a stereoscopic image display substrate capable of displaying a 3-dimensional (3D) stereoscopic image, a stereoscopic image display panel having the stereoscopic image display substrate, and a stereoscopic system having the stereoscopic image display substrate.

2. Discussion of the Background

With an increased demand for 3-dimensional (3D) stereoscopic image technology for its applicability in films, games, etc., a stereoscopic image display apparatuses capable of displaying a 2-dimensional (2D) image and a 3D stereoscopic image has been developed.

A 3D stereoscopic image may be displayed by exploiting the binocular parallax of both eyes. Methods for displaying a 3D stereoscopic image may be classified into a stereoscopic type method and an auto-stereoscopic type method. The stereoscopic type method may include a time-divisional type shutter glasses method, a space-divisional type polarizing glasses method, and the like.

A display system using the space-divisional type polarizing glasses method may include a display apparatus and a pair of polarizing glasses. The display apparatus may include a display panel.

Further, a crosstalk may be displayed on the display panel using the space-divisional polarizing glasses method.

The above information disclosed in this background section is provided for enhancement of understanding of the background of the invention and therefore it may contain information that may not be prior art that is already known in this country to a person of ordinary skill in the art.

SUMMARY

Exemplary embodiments of the present invention provide a stereoscopic image display substrate capable of increasing an aperture ratio, a stereoscopic image display panel having the stereoscopic image display substrate, and a stereoscopic image system having the stereoscopic image display substrate.

Additional features of the invention will be set forth in the description which follows, and in part will be apparent from the description, or may be learned by practice of the invention.

Example embodiments of the present invention provide a stereoscopic image display substrate including a base substrate, a data line, a plurality of gate line parts and a pixel electrode part. The data line is disposed on the base substrate. The data line extends in a first direction. The gate line parts are disposed on the base substrate. Each gate line part includes a plurality of gate lines extending in a second direction different from the first direction. The gate lines are adjacent to each other. The pixel electrode part is disposed between the gate line parts. The pixel electrode part includes at least three pixel electrodes connected to the data line.

Exemplary embodiments of the present invention provide a stereoscopic image display substrate including a substrate, a data line disposed on the substrate and extended in a first direction, a first gate line part and a second gate line part disposed on the substrate, each gate line part including a plurality of gate lines extended in a second direction, and a pixel electrode part disposed between the first gate line part and the second gate line part, the pixel electrode part including a first pixel electrode, a second pixel electrode and a third pixel electrode, in which each of the pixel electrodes is connected to the data line.

Exemplary embodiments of the present invention provide a stereoscopic image display panel including a display panel and a retarder. The display panel includes a first substrate and a second substrate. The first substrate includes a base substrate, a data line, gate line parts and pixel electrode parts. The data line is disposed on the base substrate and extends in a first direction. Each gate line part includes a plurality of gate lines. The gate lines extend in a second direction and are disposed adjacently to each other. Each pixel electrode part is disposed between adjacent gate line parts and includes at least three pixel electrodes connected to the data line. The second substrate faces the first substrate. The retarder is disposed on the display panel. The retarder includes a first pattern portion and a second pattern portion alternately corresponding to the pixel electrode parts respectively.

Exemplary embodiments of the present invention provide a stereoscopic image display system includes a stereoscopic image display panel and a pair of polarizing glasses. The stereoscopic image display panel includes a display panel and a retarder disposed on the display panel. The display panel includes a first substrate and a second substrate facing the first substrate. The first substrate includes a base substrate, a data line, gate line parts and pixel electrode parts. The data line is disposed on the base substrate and extended in a first direction. Each gate line part includes a plurality of gate lines. The gate lines extended in a second direction and disposed adjacently to each other. Each pixel electrode part is disposed between adjacent gate line parts and includes at least three pixel electrodes connected to the data line. The retarder includes a first pattern portion and a second pattern portion alternately corresponding to the pixel electrode parts respectively. The polarizing glasses include a first glass lens and a second glass lens. The first glass lens is configured to transmit an image comprising the first patterned portion, and the second glass lens is configured to transmit an image comprising the second patterned portion.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
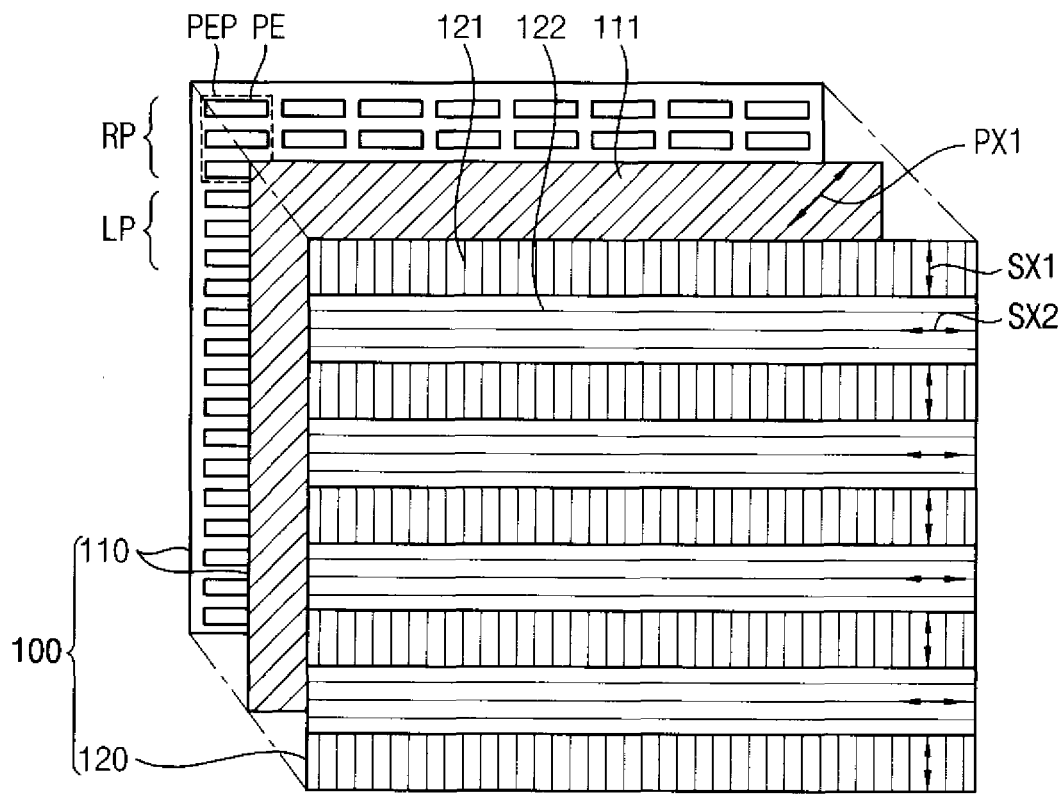
FIG. 1 is a perspective view illustrating a stereoscopic image system according to an exemplary embodiment of the present invention.
Figure 1:
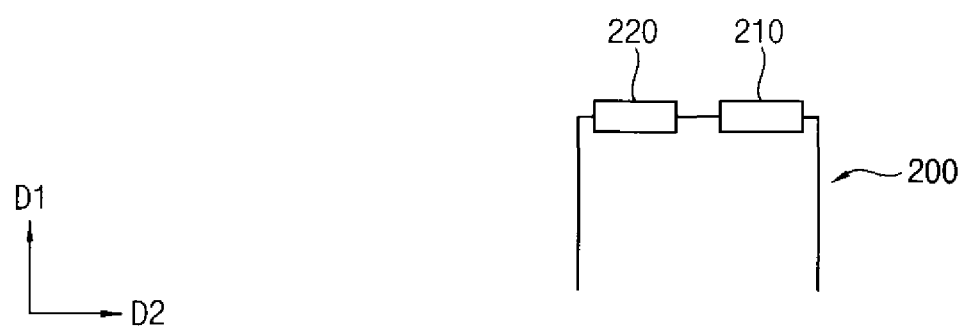

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Throughout the drawings and the detailed description, unless otherwise described, the same drawing reference numerals are understood to refer to the same elements, features, and structures. The relative size and depiction of these elements may be exaggerated for clarity.

Figure 2:
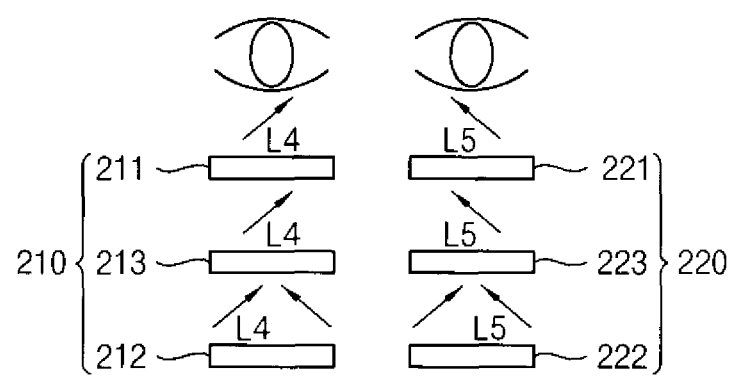
FIG. 2 is a cross-sectional view illustrating the stereoscopic image system of FIG. 1.
Figure 2:
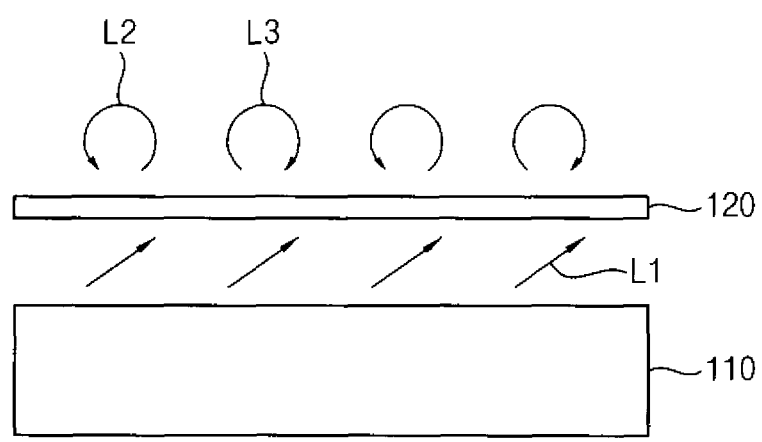

FIG. 1 is a perspective view illustrating a stereoscopic image system according to an exemplary embodiment of the present invention. FIG. 2 is a cross-sectional view illustrating the stereoscopic image system of FIG. 1.

Referring to FIG. 1 and FIG. 2, a stereoscopic image system includes a stereoscopic image display panel 100 and polarizing glasses 200.

The stereoscopic image display panel 100 includes a display panel 110 and a retarder 120 disposed on the display panel 110.

The display panel 110 includes a first stereoscopic image display substrate and a second stereoscopic image display substrate facing the first stereoscopic image display substrate. The first stereoscopic image display substrate includes an odd pixel row RP and an even pixel row LP, which may be adjacent to the odd pixel row RP, in the first direction D1. The odd pixel row RP may include pixel electrode parts PEP arranged in the second direction D2, and each pixel electrode part PEP may include one or more pixel electrodes PEs arranged in the first direction D1. The even pixel row LP may include pixel electrode parts PEP arranged in the second direction D2, and each pixel electrode part PEP may include one or more pixel electrodes PEs arranged in the first direction D1.

The display panel 110 provides a first light L1, which may be pre-polarized by a first polarizing plate 111, to the retarder 120.

The retarder 120 is disposed on the display panel 110. The retarder 120 includes a first patterned portion 121 and a second patterned portion 122. The first patterned portion extends along the odd pixel row RP, and the second pattern portion 121 extends along the even pixel row LP.

The first patterned portion 121 has a first slow phase axis SX1, and the second patterned portion 122 has a second slow phase axis SX2.

For example, the first patterned portion 121 may have the first slow phase axis SX1, which is oriented in positive 45° with respect to a first polarizing axis PX1. Thus, the first light L1 may be circularly polarized by the first patterned portion 121 to generate a second light L2. Thus, the second light L2 may be provided to the polarizing glasses 200. The second patterned portion 122 may have the second slow phase axis SX2, which is oriented in negative 45° with respect to a first polarizing axis PX1. Thus, the first light L1 may be circularly polarized by the second patterned portion 122 to generate a third light L3. Thus, the third light L3 may be provided to the polarizing glasses 200.

The first patterned portion 121 and the second patterned portion 122 have the first ground axis SX1 and the second ground axis SX2 different from each other with respect to the first polarizing axis PX1, so that the second light L2 and the third light L3 are circularly polarized in directions different from each other. For example, the second light L2 may be left-circularly polarized, and the third light L3 may be right-circularly polarized.

The polarizing glasses 200 include a first glass 210 and a second glass 220.

The first glass 210 may be designed for a right eye. The first glass 210 includes a first glass 211, a right side patterned retarder 212 and a right side polarizing plate 213. The right side polarizing plate 213 is disposed on the first glass 211, and the right side patterned retarder 212 is disposed on the right side polarizing plate 213.

The second glass 220 may be designed for a left eye. The second glass 220 includes a second glass 221, a left side patterned retarder 222 and a left side polarizing plate 223. The left side polarizing plate 223 is disposed on the second glass 221, and the left side patterned retarder 222 is disposed on the left polarizing plate 223.

The right side patterned retarder 212 may have a third light axis which is oriented in negative 45° with respect to the first slow phase axis, and the left side patterned retarder 122 may have a fourth light axis which is oriented in positive 45° with respect to the second slow phase axis. The second light L2 may be linearly polarized by the right side patterned retarder 212 to generate a fourth light L4. Thus, the fourth light L4 may be provided to the right side polarizing plate 213. The third light L3 may be linearly polarized by the left side patterned retarder 222 to generate a fifth light L5. Thus, the fifth light L5 may be provided to the left side polarizing plate 223.

The right side polarizing plate 213 transmits the fourth light L4 and the left side polarizing plate 223 transmits the fifth light L5, so that the right eye views an image displayed by the odd row pixel part RP, and the left eye views an image displayed by the even row pixel part LP. Thus, a stereoscopic image may be provided.

In addition, the display panel 110 may include color filters. Each color filter may include at least one color selected from a color group, which may include red, green, blue, cyan, magenta, yellow and white colors.

The color filters may be formed on the first stereoscopic image display substrate. Alternatively, the color filters may be formed on the second stereoscopic image display substrate.

Figure 3:
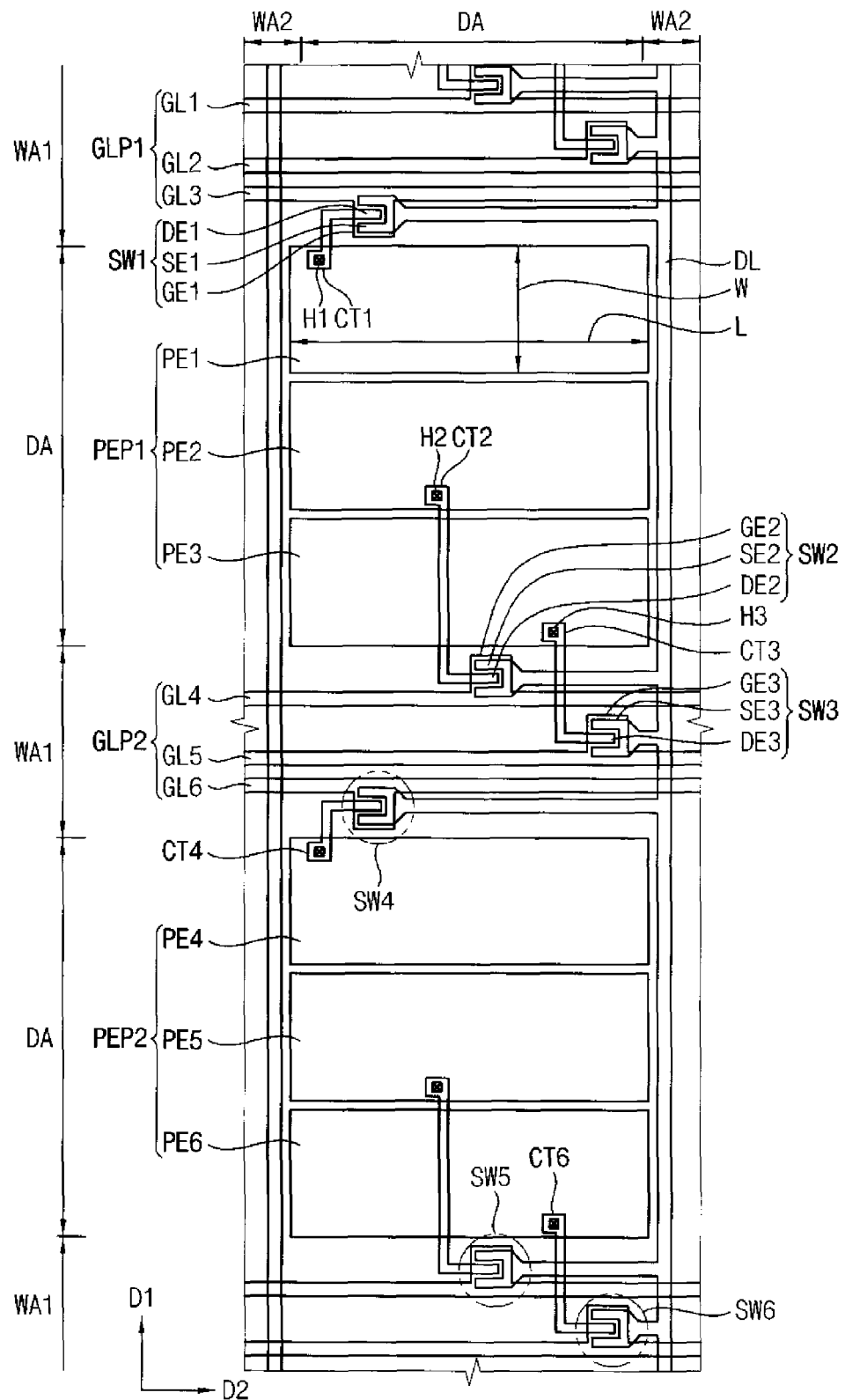
FIG. 3 is a plan view illustrating a first stereoscopic image display substrate of FIG. 1.

FIG. 3 is a plan view illustrating a first stereoscopic image display substrate of FIG. 1.

Referring to FIG. 1 and FIG. 3, a first stereoscopic image display substrate of the display panel 110 includes a first base substrate, a first gate line part GLP1, a second gate line part GLP2, a data line DL, a first pixel electrode part PEP1, a second pixel electrode part PEP2, a first switching part, a second switching part, a first contact part and a second contact part.

The first base substrate may include a display area DA, a first wiring area WA1 and a second wiring area WA2. The first wiring area WA1 extends in the second direction D2. The second wiring area WA2 extends in the first direction D1.

The display area DA is disposed between the first wiring areas WA1s in a vertical direction. In addition, the display area DA is disposed between the second wiring areas WA2s in a horizontal direction. The first wiring area WA1 is disposed between the display areas DAs.

The first gate line part GLP1 and the second gate line part GLP2 are disposed in the first wiring area WA1.

The first gate line part GLP1 includes a plurality of gate lines. Referring to FIG. 3, the first gate line part GLP1 includes a first gate line GL1, a second gate line GL2 and a third gate line GL3. The first gate line GL1, the second gate line GL2 and the third gate line GL3 extend in the second direction D2.

The second gate line part GLP2 is spaced apart from the first gate line part GLP1. The second gate line part GLP2 includes a plurality of gate lines. Referring to FIG. 3, the second gate line part GLP2 includes a fourth gate line GL4, a fifth gate line GL5 and a sixth gate line GL6. The fourth gate line GL4, the fifth gate line GL5 and the sixth gate line GL6 extend in the second direction D2.

The data line DL is disposed in the second wiring area WA2. The data line DL extends in the first direction D1.

The first pixel electrode part PEP1 and the second pixel electrode part PEP2 are disposed in the display area DA.

The first pixel electrode part PEP1 is disposed adjacent to the first gate line GLP 1, the second gate line part GLP2 and the data line DL. The first pixel electrode part PEP1 is disposed between the first gate line part GLP1 and the second gate line part GLP2.

The first pixel electrode part PEP1 includes at least three pixel electrodes. At least one of the pixel electrodes of the first pixel electrode part PEP1 is connected to at least one of the gate lines of the first gate line part GLP1, and remaining pixel electrodes of the first pixel electrode part PEP1 are connected to the gate lines of the second gate line part GLP2.

For example, the first pixel electrode PEP1 may include a first pixel electrode PE1, a second pixel electrode PE 2 and a third pixel electrode PE3. The first pixel electrode PE1, the second pixel electrode PE2 and the third pixel electrode PE3 are disposed in the first direction D1 in order.

The second pixel electrode part PEP2 is spaced apart from the first pixel electrode part PEP1. The second pixel electrode part PEP2 is disposed between the second gate line part GLP2 and a third gate line part (not shown).

The second pixel electrode part PEP2 includes at least three pixel electrodes. At least one of the pixel electrodes of the second pixel electrode part PEP2 is connected to at least one of the gate lines of the second gate line part GLP2, respectively, and remaining pixel electrodes of the second pixel electrode parte PEP2 are connected to the gate lines of the third gate line part.

For example, the second pixel electrode part PEP2 may include a fourth pixel electrode PE4, a fifth pixel electrode PE5 and a sixth pixel electrode PE6. The fourth pixel electrode PE4, the fifth pixel electrode PE5 and the sixth pixel electrode PE6 are disposed in the first direction D1 in order.

The first pixel electrode part PEP1 and the second pixel electrode part PEP2 may be disposed between the data lines that may be adjacent to each other. Alternatively, not shown, the first pixel electrode part PEP1 and the second pixel electrode part PEP2 may be disposed between the data line DL and a third pixel electrode part (not shown), which is spaced apart from the data line DL, in the second direction D2.

For example, each of the first pixel electrode PE1, the second pixel electrode PE2, the third pixel electrode PE3, the fourth pixel electrode PE4, the fifth pixel electrode PE5 and the sixth pixel electrode PE6 may have a width W and a length L, which is larger than the width W. The width W extends along the first direction D1, and the length L extends along the second direction D2.

The first pixel electrode PE1, the second pixel electrode PE 2, the third pixel electrode PE3, the fourth pixel electrode PE4, the fifth pixel electrode PE5, and the sixth pixel electrode PE6 correspond to at least three color filters. The color filters may include at least three colors selected from a color group consisting of red, green, blue, cyan, magenta, yellow and white colors.

The first switching part includes a first switching element SW1, a second switching element SW2, and a third switching element SW3. The first contact part includes a first contact electrode CT1, a second contact electrode CT2, and a third contact electrode CT3.

The first switching element SW1 includes a first gate electrode GE1, a first source electrode SE1 and a first drain electrode DE1.

The first gate electrode GE1 extends from one of the gate lines of the first gate line part GLP1 and is disposed adjacent to a first edge of the first pixel electrode part PEP1. For example, the first gate electrode GE1 may be extended from the third gate line GL3 of the first gate line part GLP1 and is disposed adjacent to the first pixel electrode PE1.

The first source electrode SE1 is extended from the data line DL. The first drain electrode DE1 is spaced apart from the first source electrode SE1 by a first space. The first source electrode SE1, the first drain electrode DE1 and the first space overlap with a portion of the first gate electrode GE1. Further, the first source electrode SE1, the first drain electrode DE1 and the first space overlap above a portion of the first gate electrode GE1, in reference to the plan view of FIG. 3.

The first contact electrode CT1 is extended from the first drain electrode DE1, and overlaps a portion of the first pixel electrode PE1. The first contact electrode CT1 may be connected to the first pixel electrode PE1 via a first contact hole H1.

The second switching element SW2 includes a second gate electrode GE2, a second source electrode SE2 and a second drain electrode DE2.

The second gate electrode GE2 is extended from one gate line of the second gate line part GLP2 and is disposed adjacent to a second edge of the first pixel electrode PEP1, which is disposed opposite to the first edge of the first pixel electrode part PEP1. For example, the second gate electrode GE2 may be extended from the fourth gate line GL4 of the second gate line part GLP2.

The second source electrode SE2 is extended from the data line DL. The second drain electrode DE2 is spaced apart from the second source electrode SE2 by a second space. The second source electrode SE2, the second drain electrode DE2 and the second space overlap with a portion of the second gate electrode GE2. Further, the second source electrode SE2, the second drain electrode DE2 and the second space overlap above a portion of the second gate electrode GE2, in reference to the plan view of FIG. 3.

The second contact electrode CT2 extends from the second drain electrode DE2, and overlaps a portion of the second pixel electrode PE2. The second contact electrode CT2 overlaps a portion of the third pixel electrode PE3.

The third switching element SW3 includes a third gate electrode GE3, a third source electrode SE3 and a third drain electrode DE3.

The third gate electrode GE3 is extended from one gate line of the second gate line part GLP2 and is disposed adjacent to a second end of the third pixel electrode PE3. For example, the third gate electrode GE3 may be extended from the fifth gate line GL5 of the second gate line part GLP2.

The third source electrode SE3 is extended from the data line DL. The third drain electrode DE3 is spaced apart from the third source electrode SE3 by a third space. The third source electrode SE3, the third drain electrode DE3 and the third space overlap with a portion of the third gate electrode GE3. Further, the third source electrode SE3, the third drain electrode DE3 and the third space overlap above a portion of the third gate electrode GE3, in reference to the plan view of FIG. 3.

The third contact electrode CT3 is extended from the third drain electrode DE3, and overlaps a portion of the third pixel electrode PE3. The third contact electrode CT3 may be connected to the third pixel electrode PE3 via a third contact hole H3.

The second switching part includes a fourth switching element SW4, a fifth switching element SW5, and a sixth switching element SW6. The second contact part includes the fourth contact electrode CT4, the fifth contact electrode CT5, and the sixth contact electrode CT6.

The fourth switching element SW4, the fifth switching element SW5, and the sixth switching element SW6 may be similar to the first switching element SW1, the second switching element SW2, and the third switching element SW3, respectively. Further, the fourth contact electrode CT4, the fifth contact electrode CT5, and the sixth contact electrode CT6 may be similar to the first contact electrode CT1, the second contact electrode CT2, and the third contact electrode CT3, respectively. Accordingly, repetitive explanation concerning the above elements will be omitted.

The display panel 110 may further include a storage line (not shown) that is extended in the second direction D2, and disposed between the first pixel electrode part PEP1 and the first gate line part GLP1, or disposed between the first pixel electrode part PEP1 and the second gate line part GLP2. The storage line may extend in the first direction D1 to overlap with at least one of the data line DL and the first pixel electrode part PEP1.

According to exemplary embodiments of the present invention, the first pixel electrode, the second pixel electrode, and the third pixel electrode PE3 may be connected to one data line DL, so that the number of the data lines may decrease. Thus, the number of source drivers connected to the data line may decrease, so that a manufacturing cost may decrease.

In addition, as the number of the data lines decreases, a light blocking area on which data lines may typically be disposed may be reduced. Thus, the aperture ratio may increase.

In addition, as the first gate line GL1, the second gate line GL2, and the third gate line GL3 are concentrically disposed in the first wiring area WA1, which may be disposed between the first pixel electrode part PEP1 and the second pixel electrode part PEP2, the aperture ratio may be increased in comparison to an alternative wiring scheme. The alternative wiring scheme may include a first gate line, a second gate line, and a third gate line are dispersed to correspond to a first pixel electrode, a second pixel electrode, and a third pixel electrode, respectively. Further, referring to the alternative wiring scheme, an area between the first pixel electrode part and the second pixel electrode part, in which the third gate line may be disposed, may have a larger width than a wiring area, in which each of the first gate line and second gate lines may be disposed, in order to reduce the likelihood of crosstalk.

That is, in the alternative wiring scheme, the light transmitting the odd pixel row may transmit a second pattern portion instead of a first pattern portion due, at least in part, to an amount of spaced distance between a retarder and a color filter pattern of a display panel or a liquid crystal layer. Accordingly, crosstalk may be generated. In the alternative wiring scheme, in order to reduce the likelihood of crosstalk, the area, in which the third gate line may be disposed, has been designed to have a larger width than an area, in which each of the first and second gate lines may be disposed. In exemplary embodiments of the present invention, the first gate line GL1, the second gate line GL2, and the third gate line GL3 may be concentrically disposed in the area W1, in which the third gate lines may typically be disposed in the alternative wiring scheme, so that the light blocking area, in which the first gate line and second gate line in the alternative wiring scheme may typically be disposed, may be reduced. Thus, the aperture ratio may be increased in comparison to the alternative wiring scheme.

Figure 4:
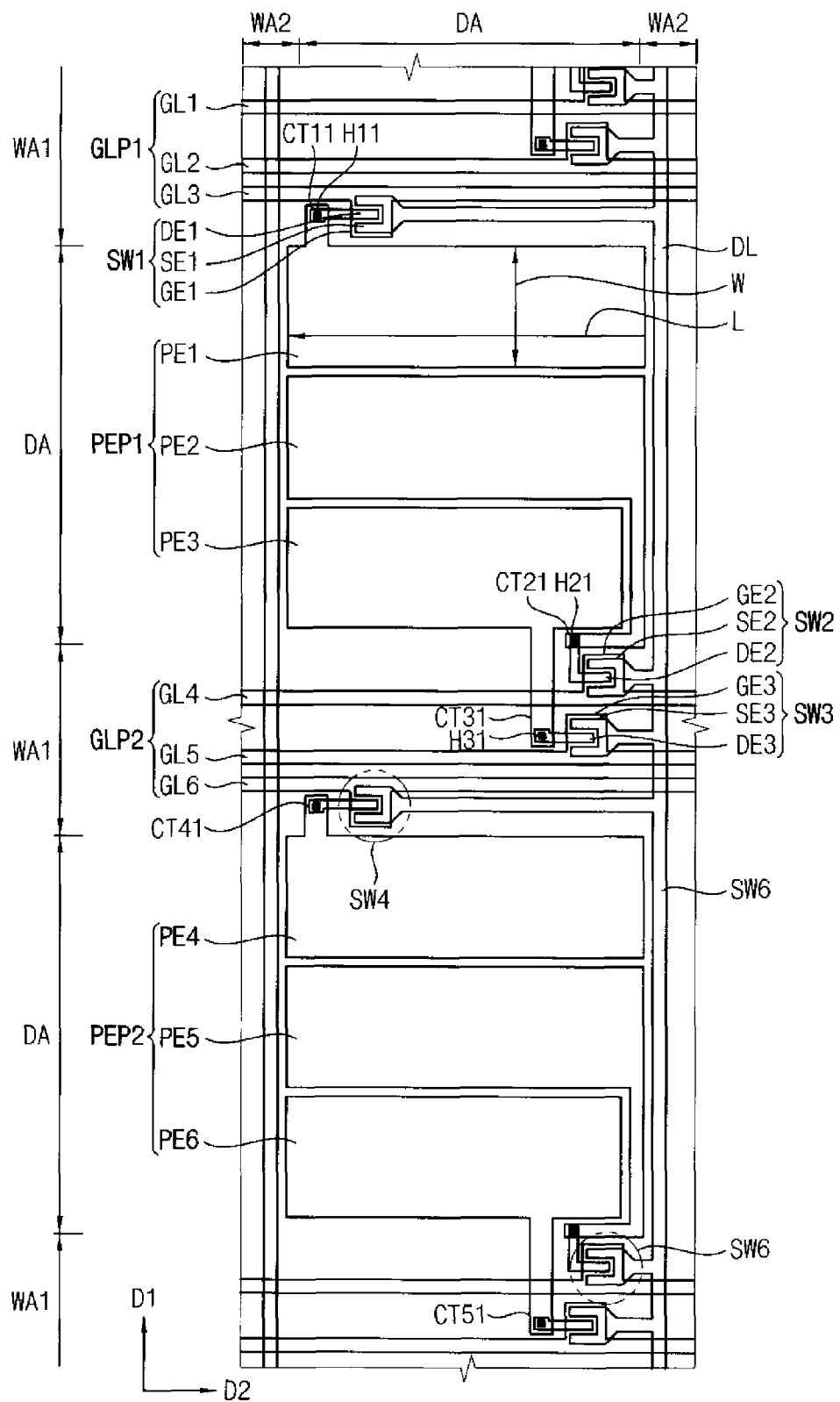
FIG. 4 is a plan view illustrating a first stereoscopic image display substrate of a stereoscopic image display system according to an exemplary embodiment of the present invention.

FIG. 4 is a plan view illustrating a first stereoscopic image display substrate of a stereoscopic image display system according to an exemplary embodiment of the present invention.

A stereoscopic image system according to exemplary embodiments may be similar to the stereoscopic image system of FIG. 1, with an exception of a contact part, and thus the same reference numerals will be used to refer to the same or like parts as those described with respect to the stereoscopic image system of FIG. 1 and any repetitive explanation concerning the above elements will be omitted. Further, although the features of FIG. 4 will be described in reference to the stereoscopic image system of FIG. 1, but it is not limited thereto. For the purposes of the present disclosure, it will be understood that a stereoscopic image system with similar specifications or complying with similar or compatible standards may also be used.

Referring to FIG. 4, a first contact part of the display panel 110 may include a first contact electrode 11, a second contact electrode 21, and a third contact electrode CT31.

The first contact electrode CT11 is extended from the first pixel electrode PE1, and overlaps a portion of the first drain electrode DE1. The first contact electrode CT11 may be disposed adjacent to the first gate line part GLP1. The first contact electrode CT11 is connected to the first drain electrode DE1 via a first contact hole H11, which is disposed in the first wiring area WA1. The first contact electrode CT11 is adjacent to the third gate line GL3 of the first gate line part GLP1.

The second contact electrode CT21 is extended from the second pixel electrode PE2, and overlaps a portion of the second drain electrode DE2. The second contact electrode CT21 may be disposed adjacent to the second gate line part GLP2. The second contact electrode CT21 is connected to the second drain electrode DE2 via a second contact hole H21, which is disposed in the first wiring area WA1. The second contact electrode CT21 is adjacent to the fourth gate line GL4 of the second gate line part GLP2.

The third contact electrode CT31 is extended from the third pixel electrode PE3, and overlaps a portion of the third drain electrode DE3. The third contact electrode CT31 may be disposed adjacent to the second gate line part GLP2. The third contact electrode CT31 is connected to the third drain electrode DE3 via a third contact hole H31, and an end portion of the third contact electrode CT31 is disposed between the fourth gate line GL4 and the fifth gate line GL5.

A second contact part of the display panel 110 includes a fourth contact electrode CT41, a fifth contact electrode CT51, and a sixth contact electrode CT61.

The fourth contact electrode CT41, the fifth contact electrode CT51, and the sixth contact electrode CT61 may be similar to the first contact electrode CT11, the second contact electrode CT21, and the third contact electrode CT31, and thus any repetitive explanation concerning above elements will be omitted.

According to exemplary embodiments of the invention, the first contact electrode CT11, the second contact electrode CT21, and the third contact electrode CT31; and the first contact hole H11, the second contact hole H12, and the third contact hole H31 are disposed in the first wiring area WA1, so that the aperture ratio of the display area DA may be increased.

Figure 5:
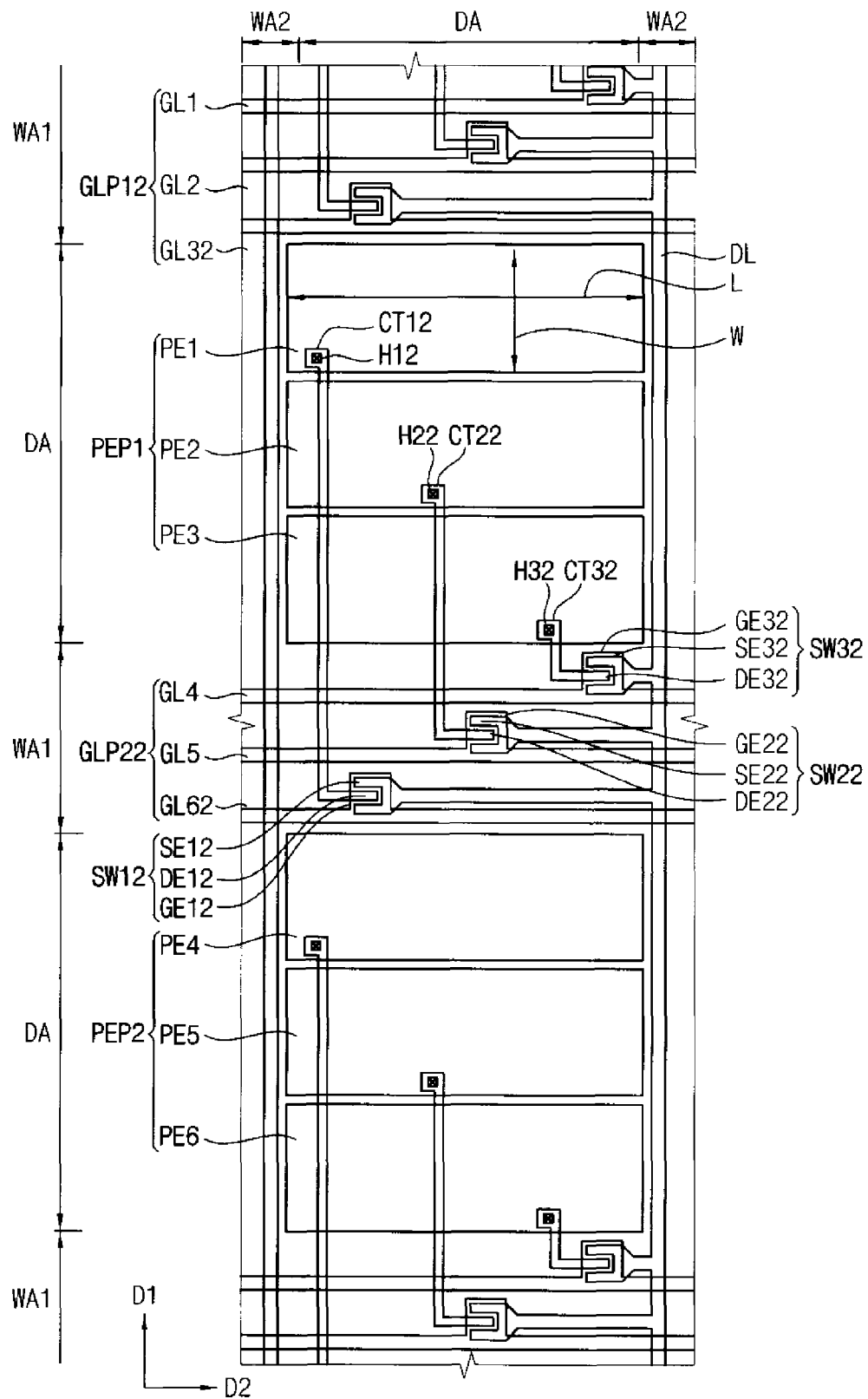
FIG. 5 is a plan view illustrating a first stereoscopic image display substrate of a stereoscopic image display system according to an exemplary embodiment of the present invention.

FIG. 5 is a plan view illustrating a first stereoscopic image display substrate of a stereoscopic image display system according to an exemplary embodiment of the present invention.

A stereoscopic image system according to exemplary embodiments may be similar to the stereoscopic image system of FIG. 1, with an exception of a gate line connected to a first pixel electrode, a first switching element connected to the gate line and a first contact electrode extended from the first switching element. Accordingly, the same reference numerals will be used to refer to the same or like parts as those described in the stereoscopic image system of FIG. 1 and any repetitive explanation concerning the above elements will be omitted. Further, although the features of FIG. 5 will be described in reference to the stereoscopic image system of FIG. 1, but it is not limited thereto. For the purposes of the present disclosure, it will be understood that a stereoscopic image system with similar specifications or complying with similar or compatible standards may also be used.

Referring to FIG. 5, a first gate line part GLP12 of the display panel includes a first gate line GL1, a second gate line GL2, and a third gate line GL32.

A second gate line part GLP22 of the display panel includes a fourth gate line GL4, a fifth gate line GL5, and a sixth gate line GL62.

The first switching part of the display panel includes a first switching element SW12, a second switching element SW22, and a third switching element SW32. The first contact part of the display panel includes a first contact electrode CT12, a second contact electrode CT22, and a third contact electrode CT32.

The first switching element SW12 includes a first gate electrode GE12, a first source electrode SE12 and a first drain electrode DE12.

The first gate electrode GE12 is extended from one of the gate lines of the second gate line part GLP22, which is disposed adjacent to a first edge of the third pixel electrode PE3. For example, the first gate electrode GE12 may be extended from the sixth gate line GL62 of the second gate line part GLP22.

The first source electrode SE12 is extended from the data line DL. The first drain electrode DE12 is spaced apart from the first source electrode SE12 by a first space. The first source electrode SE12, the first drain electrode DE12 and the first space overlap with a portion of the first gate electrode GE12. Further, the first source electrode SE12, the first drain electrode DE12 and the first space overlap above a portion of the first gate electrode GE12, in reference to the plan view of FIG. 5.

The first contact electrode CT12 is extended from the first drain electrode DE12, and overlaps with a portion of the first pixel electrode PE12. The first contact electrode CT12 may be connected to the first pixel electrode PE1 via the first contact hole H12. The first contact electrode CT12 overlaps with the second pixel electrode PE2 and the third pixel electrode PE3.

The second switching element SW22 includes a second gate electrode GE22, a second source electrode SE22 and a second drain electrode DE22.

The second gate electrode GE22 is extended from one of the gate lines of the second gate line part GLP22, which is not connected to the first gate electrode GE12. For example, the second gate electrode GE22 may be extended from the fifth gate line GL5 of the second gate line part GLP22.

The second source electrode SE22 is extended from the data line DL. The second drain electrode DE22 is spaced apart from the second source electrode SE22 by a first space. The second source electrode SE22, the second drain electrode DE22 and the second space overlap with a portion of the second gate electrode GE22. Further, the second source electrode SE22, the second drain electrode DE22 and the second space overlap above a portion of the second gate electrode GE22, in reference to the plan view of FIG. 5.

The second contact electrode CT22 is extended from the second drain electrode DE22, and overlaps with the second pixel electrode PE22. The second contact electrode CT22 is connected to the second pixel electrode PE22 via a second contact hole H22. The second contact electrode CT22 overlaps with the third pixel electrode PE3.

The third switching element SW32 includes a third gate electrode GE32, a third source electrode SE32 and a third drain electrode DE32.

The third gate electrode GE32 is extended from a gate line of the second gate line part GLP22, which is not connected to the first gate electrode GE12 and the second gate electrode GE22. For example, the third gate electrode GE32 may be extended from the fourth gate line GL4 of the second gate line part GLP22.

The third source electrode SE32 is extended from the data line DL. The third drain electrode DE32 is spaced apart from the third source electrode SE32 by the third space. The third source electrode SE32, the third drain electrode DE32 and the third space overlap with a portion of the third gate electrode GE32. Further, the third source electrode SE32, the third drain electrode DE32 and the third space overlaps above a portion of the third gate electrode GE32, in reference to the plan view of FIG. 5.

The third contact electrode CT32 is extended from the third drain electrode DE32, and overlaps with a portion of the third pixel electrode PE32. The third contact electrode CT32 may be connected to the third pixel electrode PE32 via a third contact hole H32.

According to exemplary embodiments of the invention, as the number of the data lines decreases, a light blocking area on which multiple data lines may be typically disposed may be reduced. Thus, the aperture ration may be increased.

In addition, as the gate lines are concentrically disposed in the first wiring area WA1, the aperture ratio may be increased.

Figure 6:
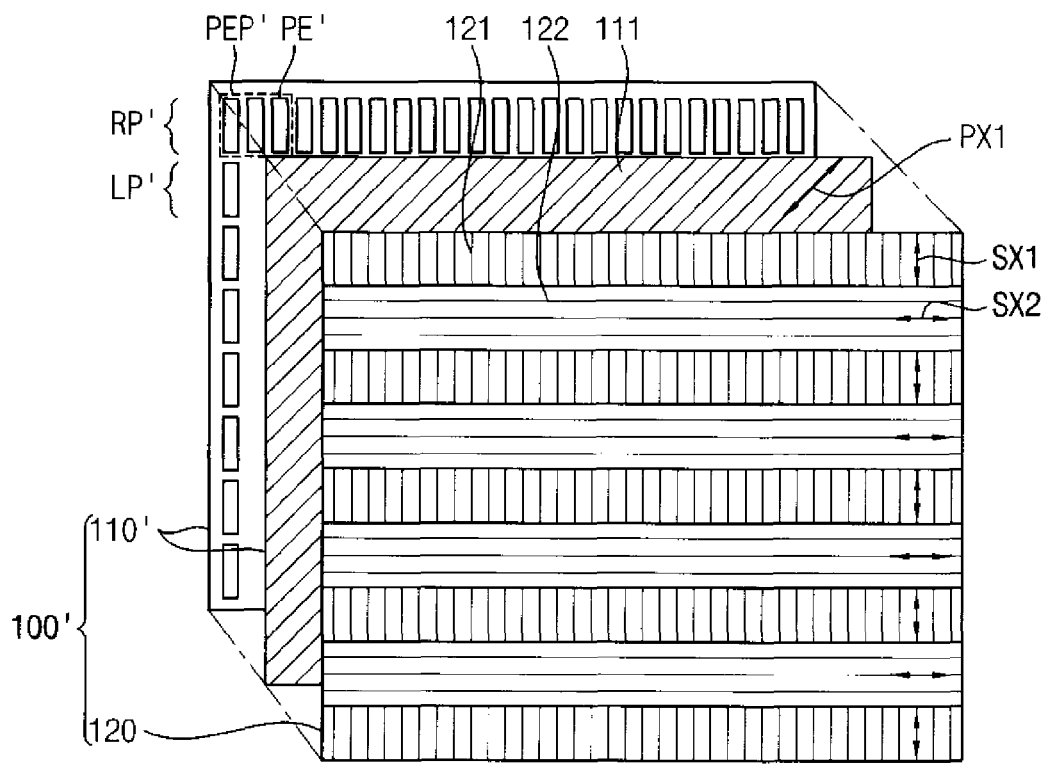
FIG. 6 is a perspective view illustrating a stereoscopic image system according to an exemplary embodiment of the present invention.
Figure 6:
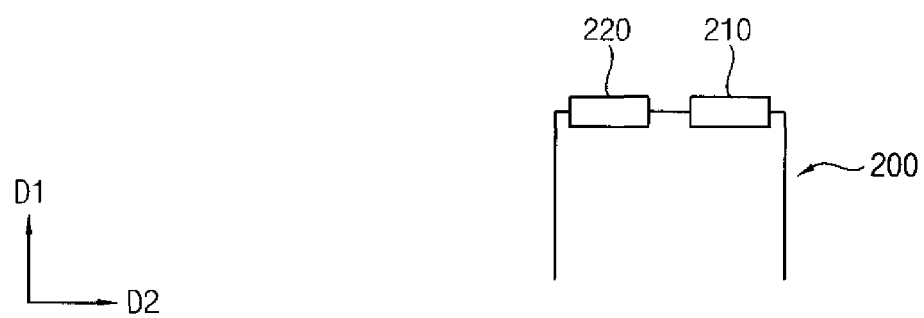

FIG. 6 is a perspective view illustrating a stereoscopic image system according to an exemplary embodiment of the present invention.

A stereoscopic image system according to exemplary embodiments may be similar to the stereoscopic image system of FIG. 1, with an exception of an arrangement direction of pixel electrodes of a pixel electrode part, and thus the same reference numerals will be used to refer to the same or like parts as those described in the stereoscopic image system of FIG. 1 and any repetitive explanation concerning the above elements will be omitted. Further, although the features of FIG. 6 will be described in reference to the stereoscopic image system of FIG. 1, but it is not limited thereto. For the purposes of the present disclosure, it will be understood that a stereoscopic image system with similar specifications or complying with similar or compatible standards may also be used.

Referring to FIG. 6, a display panel of a stereoscopic image system includes an odd pixel row and an even pixel row.

The odd pixel row includes pixel electrode parts PEP' arranged in a second direction D2, and each pixel electrode part PEP' includes three pixel electrodes PE' arranged in the second direction D2. The even pixel row is disposed adjacent to the odd pixel row in a first direction D1 and includes pixel electrode parts PEP' arranged in the second direction D2, in which each pixel electrode part PEP' includes three pixel electrodes PE' arranged in the second direction D2.

A retarder 120 of the stereoscopic image system is disposed on the display panel. The retarder 120 includes a first patterned portion 121 and a second patterned portion 122. The first patterned portion 121 extends along the odd pixel row RP, and the second patterned portion 122 extends along the even pixel row LP.

Figure 7:
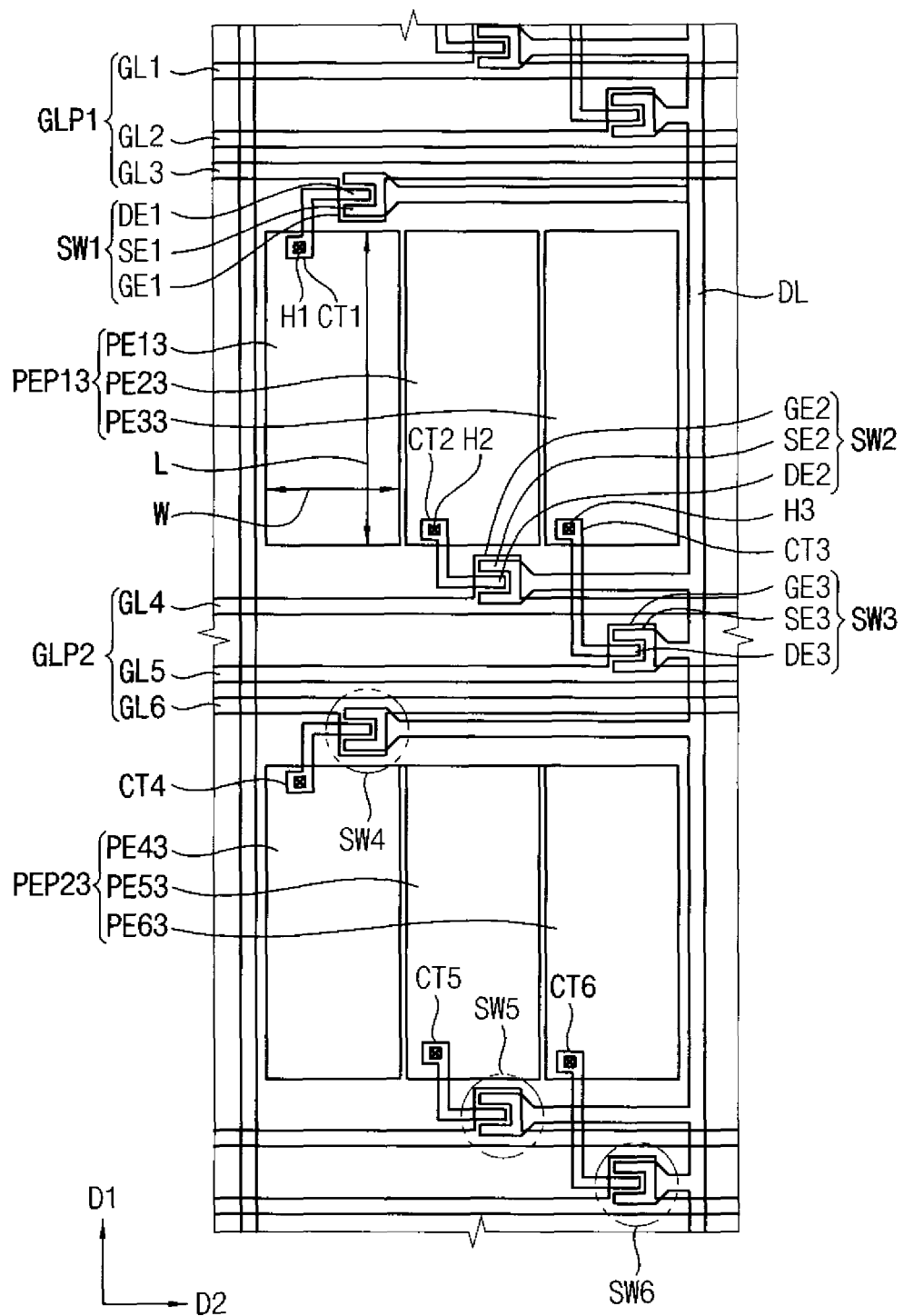
FIG. 7 is a plan view illustrating a first stereoscopic image display substrate of a stereoscopic image display panel of FIG. 6.

FIG. 7 is a plan view illustrating a first stereoscopic image display substrate of a display panel of FIG. 6.

Referring to FIG. 7, a first pixel electrode part PEP13 of a first stereoscopic image display substrate of a display panel includes at least three pixel electrodes. For example, a first pixel electrode part PEP13 may include a first pixel electrode PE13, a second pixel electrode PE23, and a third pixel electrode PE33. The first pixel electrode PE13, the second pixel electrode PE23, and the third pixel electrode PE33 are disposed in the second direction in order.

A second pixel electrode part PEP23 of the first stereoscopic image display substrate of the display panel is spaced apart from the first pixel electrode part PEP13 in the first direction D1. The second pixel electrode part PEP23 is disposed between the second gate line part GLP2 and the third gate line part (not shown), which may be adjacent to each other. The second pixel electrode part PEP23 includes a plurality of pixel electrodes. For example, the second pixel electrode part PEP23 may include a fourth pixel electrode PE43, a fifth pixel electrode PE53, and a sixth pixel electrode PE63. The fourth pixel electrode PE43, the fifth pixel electrode PE53, and the sixth pixel electrode PE63 are disposed in the second direction D2 in order.

For example, each of the first pixel electrode PE13, the second pixel electrode PE23, the third pixel electrode PE33, the fourth pixel electrode PE43, the fifth pixel electrode PE53, and the sixth pixel electrode PE63 may have a width W and a length L, in which the length L is larger than the width W. The width W extends along the second direction D2, and the length L extends along the first direction D1.

A first switching part of the display panel includes a first witching element SW1, a second switching element SW2, and a third switching element SW3. The first contact part includes a first contact electrode CT1, a second contact electrode CT2, and a third contact electrode CT3.

The first switching element SW1 includes a first gate electrode GE1, a first source electrode SE1 and a first drain electrode DE1.

The first gate electrode GE1 is extended from one of the gate lines of the first gate line part GLP1, which is disposed adjacent to a first edge of the first pixel electrode part PEP13. For example, the first gate electrode GE1 may be extended from the third gate line GL3 of the first gate line part GLP2, and is disposed adjacent to the first pixel electrode PE13.

The first contact electrode CT1 is extended from the first drain electrode DE1, and overlaps with a portion of the first pixel electrode PE13. The first contact electrode CT1 may be connected to the first pixel electrode Pe13 via a first contact hole H1.

The second switching element SW2 includes a second gate electrode GE2, a second source electrode SE2 and a second drain electrode DE2.

The second gate electrode GE2 is extended from one of the gate lines of the second gate line part GLP2, and is disposed adjacent to a second edge of the first pixel electrode part PEP13, which may be disposed opposite to the first edge of the first pixel electrode part PEP13. For example, the second gate electrode GE2 may be extended from the fourth gate line GL4 of the second gate line part GLP2.

The second contact electrode CT2 is extended from the second drain electrode DE2, and overlaps with a portion of the second pixel electrode PE23. The second contact electrode CT2 may be connected to the second pixel electrode PE23 via the second contact hole H2.

The third switching element SW3 includes a third gate electrode GE3, a third source electrode SE3 and a third drain electrode DE3.

The third gate electrode GE3 is extended from a gate line of the second gate line part GLP2. For example, the third gate electrode GE3 may be extended from the fifth gate line GL5 of the second gate line part GLP2.

The third contact electrode CT3 is extended from the third drain electrode DE3, and overlaps with a portion of the third pixel electrode PE33. The third contact electrode CT3 may be connected to the third pixel electrode PE33 via the third contact hole H3.

The second switching part includes a fourth switching element SW4, a fifth switching element SW5, and a sixth switching element SW6. The second contact part includes a fourth contact electrode CT4, a fifth contact electrode CT5, and a sixth contact electrode CT6.

The fourth switching element SW4, the fifth switching element SW5, and the sixth switching element SW6 may be similar to the first switching element SW1, the second switching element SW2, and the third switching element SW3, respectively. Further, the fourth contact electrode CT4, the fifth contact electrode CT5, and the sixth contact electrode CT6 may be similar to the first contact electrode CT1, the second contact electrode CT2, and the third contact electrode CT3, respectively. Accordingly, repetitive explanation concerning the above elements will be omitted.

According to exemplary embodiments of the invention, each of the first pixel electrode PE13, the second pixel electrode PE23, and the third pixel electrode PE33 has the width extended in the second direction D2, so that a likelihood that a color transmitted by the first pixel electrode PE13 or the third pixel electrodes PE33 being blocked may be reduced. The color may refer to at least one color of three colors selected from a color group, which includes red, green, blue, cyan, magenta, yellow, and white. Thus, the likelihood of color crosstalk being generated may be reduced.

Figure 8:
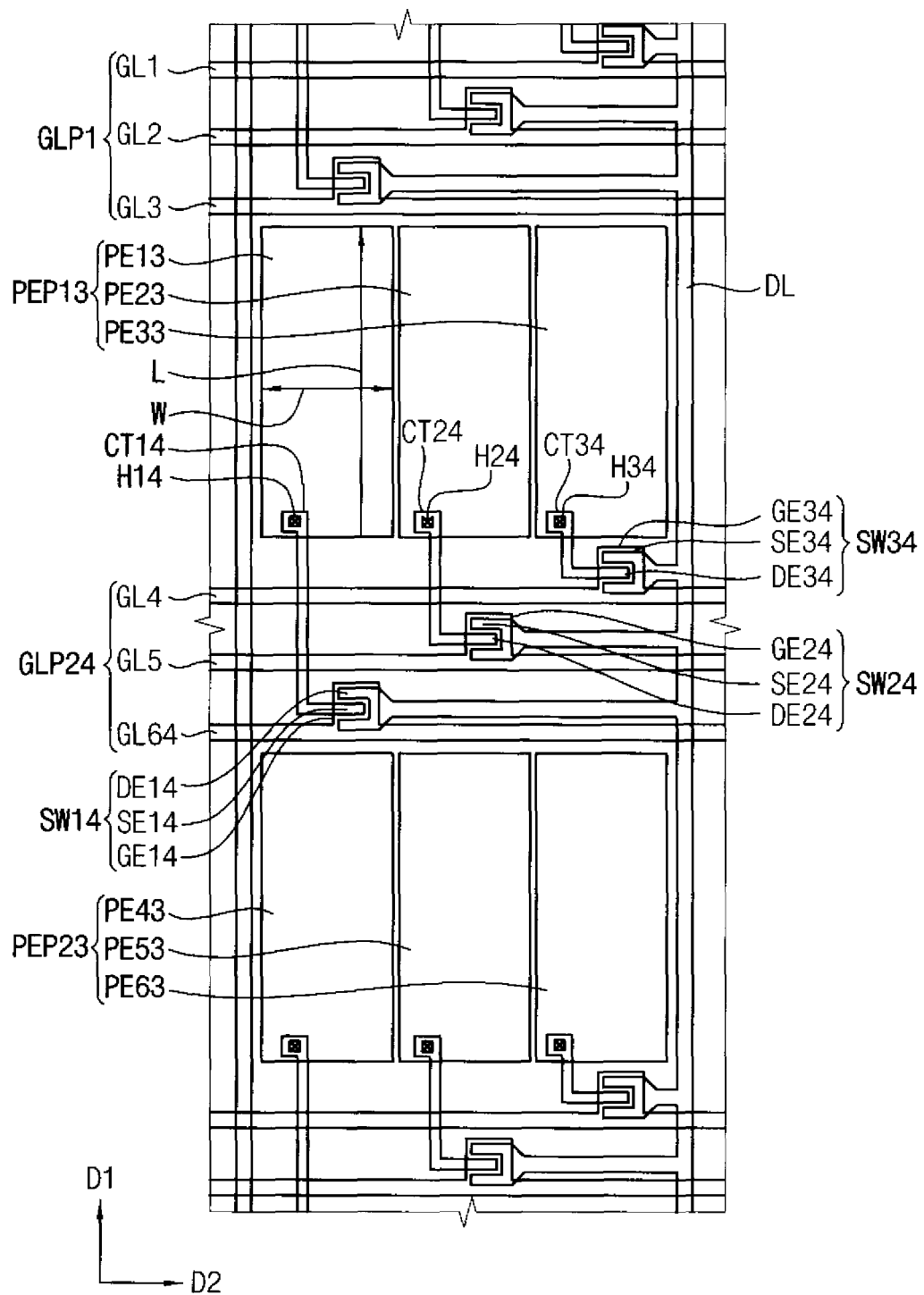
FIG. 8 is a plan view illustrating a first stereoscopic image display substrate of a stereoscopic image system according to an exemplary embodiment of the present invention.

FIG. 8 is a plan view illustrating a first stereoscopic image display substrate of a stereoscopic image system according to an exemplary embodiment of the present invention.

A stereoscopic image system according exemplary embodiments may be similar to the stereoscopic image system of FIG. 1, with an exception of a gate line connected to a first pixel electrode, a first switching element connected to the gate line and a first contact electrode extended from the first switching element, and thus the same reference numerals will be used to refer to the same or like parts as those described with respect to the stereoscopic image system of FIG. 1. Accordingly, repetitive explanation concerning the above elements will be omitted.

Referring to FIG. 8, a first gate line part GLP1 of the display panel includes a first gate line GL1, a second gate line GL2, and a third gate line GL3.

A second gate line part GLP24 of the display panel includes a fourth gate line 4, a fifth gate line GL5, and a sixth gate line GL6.

The first switching part of the display panel includes a first switching element SW14, a second switching element SW24, and a third switching element SW34. The first contact part of the display panel includes a first contact electrode CT14, a second contact electrode CT24, and a third contact electrode CT34.

The first switching element SW14 includes a first gate electrode GE14, a first source electrode SE14 and a first drain electrode DE14.

The first gate electrode GE14 is extended from a gate line of the second gate line part GLP24, which is disposed adjacent to a second edge of the first pixel electrode part PEP13. For example, the first gate electrode GE14 may be extended from the sixth gate line GL64 of the second gate line part GLP24.

The first source electrode SE14 is extended from the data line DL. The first drain electrode DE14 is spaced apart from the first source electrode SE14 by a first space. The first source electrode SE14, the first drain electrode DE14 and the first space overlap with a portion of the first gate electrode GE14. Further, the first source electrode SE14, the first drain electrode DE14 and the first space overlap above a portion of the first gate electrode GE14, in reference to FIG. 8.

The first contact electrode CT14 is extended from the first drain electrode DE14, and overlaps with a portion of the first pixel electrode PE13. The first contact electrode CT14 may be connected to the first pixel electrode PE13 via the first contact hole H14.

The second switching element SW24 includes a second gate electrode GE24, a second source electrode SE24 and a second drain electrode DE24.

The second gate electrode GE24 is extended from one of the gate lines, which is not connected to the first gate electrode GE14 of the second gate line part GLP24. For example, the second gate electrode GE24 may be extended from the fifth gate line GL5 of the second gate line part GLP24.

The second source electrode SE24 is extended from the data line DL. The second drain electrode DE24 is spaced apart from the second source electrode SE24 by a second space. The second source electrode SE24, the second drain electrode DE24 and the second space overlap with a portion of the second gate electrode GE24. Further, the second source electrode SE24, the second drain electrode DE24, and the second space overlap above a portion of the second gate electrode GE24, in reference to the plan view of FIG. 8.

The second contact electrode CT24 is extended from the second drain electrode DE24, and overlaps with the second pixel electrode PE23. The second contact electrode CT24 is connected to the second pixel electrode PE23 via a second contact hole H24.

The third switching element SW34 includes a third gate electrode GE34, a third source electrode SE34 and a third drain electrode DE34.

The third gate electrode GE34 is extended from a gate line of the second gate line part GLP24, which is not connected to the first gate electrode GE14 or to the second gate electrode GE24. For example, the third gate electrode GE34 may be extended from the fourth gate line GL4 of the second gate line part GLP24.

The third source electrode SE34 is extended from the data line DL. The third drain electrode DE34 is spaced apart from the third source electrode SE34 by the third space. The third source electrode SE34, the third drain electrode DE34 and the third space overlap with a portion of the third gate electrode GE34. Further, the third source electrode SE34, the third drain electrode DE34 and the third space overlaps above a portion of the third gate electrode GE34, in reference to the plan view of FIG. 8.

The third contact electrode CT34 is extended from the third drain electrode DE34, and overlaps with a portion of the third pixel electrode PE33. The third contact electrode CT34 may be connected to the third pixel electrode PE33 via a third contact hole H34.

According to exemplary embodiments of the invention, as the number of the data lines decreases, a light blocking area on which multiple data lines may be typically disposed may be reduced. Thus, the aperture ratio may be increased.

In addition, as the gate lines are concentrically disposed in the first wiring area WA1, the aperture ratio may be increased.

Figure 9:
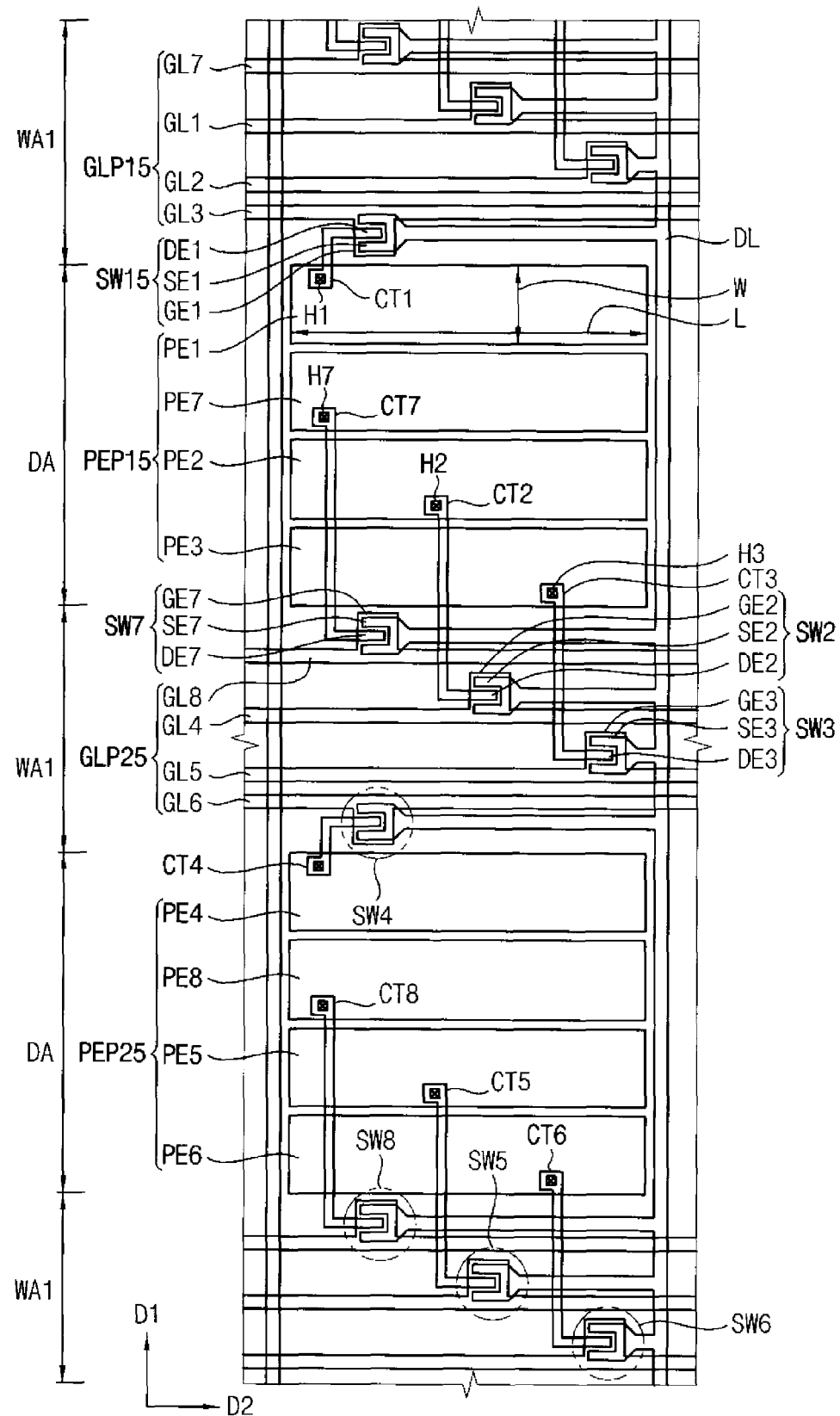
FIG. 9 is a plan view illustrating a first stereoscopic image display substrate of a stereoscopic image system according to an exemplary embodiment of the present invention.

FIG. 9 is a plan view illustrating a first stereoscopic image display substrate of a stereoscopic image system according to an exemplary embodiment of the present invention.

A stereoscopic image system according to exemplary embodiments may be similar to the stereoscopic image system of FIG. 1, with an exception of a first gate line part, a second gate line part, a first pixel electrode part, a second pixel electrode part, a first switching part, a second switching part, a first contact part and a second contact part. Accordingly, the same reference numerals will be used to refer to the same or like parts as those described with reference to the stereoscopic image system of FIG. 1 and repetitive explanation concerning the above elements will be omitted. Further, although the features of FIG. 9 will be described in reference to the stereoscopic image system of FIG. 1, but it is not limited thereto. For the purposes of the present disclosure, it will be understood that a stereoscopic image system with similar specifications or complying with similar or compatible standards may also be used.

Referring to FIG. 9, the first gate line part GLP15 includes a first gate line GL1, a second gate line GL2, a third gate line GL3 and a seventh gate line GL7. The first gate line GL1, the second gate line GL2, the third gate line GL3 and the seventh gate line GL7 extend in a second direction D2.

The second gate line part GLP25 is spaced apart from the first gate line part GLP15. The second gate line part GLP25 includes a fourth gate line GL4, a fifth gate line GL5, a sixth gate line GL6 and an eighth gate line GL8. The fourth gate line GL4, the fifth gate line GL5, the sixth gate line GL6 and the eighth gate line GL8 extend in the second direction D2.

The first pixel electrode part PEP15 includes four pixel electrodes. At least one of the pixel electrodes of the first pixel electrode part PEP15 is connected to at least one of the gate lines of the first gate line part GLP15. Remaining pixel electrodes of the first pixel electrode part PEP15, with the exception of the pixel electrode connected to the gate line of the first gate line part GLP15, are connected to the gate lines of the second gate line part GLP25.

For example, the first pixel electrode part PEP15 includes a first pixel electrode PE1, a second pixel electrode PE2, a third pixel electrode PE3, and a seventh pixel electrode PE7. The first pixel electrode PE1, the second pixel electrode PE2, the third pixel electrode PE3, and the seventh pixel electrode PE7 are disposed in the first direction D1 in order.

The second pixel electrode part PEP25 is spaced apart from the first pixel electrode part PEP15 in the first direction D1. The second pixel electrode part PEP25 is disposed between the second gate line part GLP25 and the third gate line part (not pictured), which may be adjacent to the second gate line part GLP25.

The second pixel electrode part PEP25 includes four pixel electrodes. At least one of the pixel electrodes of the second pixel electrode part PEP25 is connected to at least one of the gate lines of the second gate line part GLP25. Remaining pixel electrodes of the second pixel electrode part PEP25, with an exception of the pixel electrode connected to the gate line of the second gate line part GLP25, are connected to the gate lines of the third gate line part.

For example, the second pixel electrode part PEP25 may include a fourth pixel electrode PE4, a fifth pixel electrode PE5, a sixth pixel electrode PE6 and an eighth pixel electrode PE8. The fourth pixel electrode PE4, the fifth pixel electrode PE5, the sixth pixel electrode PE6 and the eighth pixel electrode PE8 are disposed in the first direction D1 in order.

For example, each of the first pixel electrode PE1, the second pixel electrode PE2, the third pixel electrode PE3, the fourth pixel electrode PE4, the fifth pixel electrode PE5, the sixth pixel electrode PE6, the seventh pixel electrode PE7 and the eighth pixel electrode PE8 may have a width W and a length L, which may be larger than the width W. The width W extends along the first direction D1, and the length L extends along the second direction D2.

The first switching part includes a first switching element SW15, a second switching element SW2, a third switching element SW3 and a seventh switching element SW7. The first contact part includes a first contact electrode CT1, a second contact electrode CT2, a third contact electrode CT3, and a seventh contact electrode CT7.

The seventh switching element SW7 includes a seventh gate electrode GE7, a seventh source electrode SE7 and a seventh drain electrode DE7.

The seventh gate electrode GE7 is extended from a gate line of the second gate line part GLP25. For example, the seventh gate electrode GE7 may be extended from the eighth gate line GL8 of the second gate line part GLP25.

The seventh source electrode SE7 is extended from the data line DL. The seventh drain electrode DE7 is spaced apart from the seventh source electrode SE7 by a seventh space. The seven source electrode SE7, the seventh drain electrode DE7 and the seventh space overlap with a portion of the seventh gate electrode GE7. Further, the seven source electrode SE7, the seventh drain electrode DE7 and the seventh space overlap above a portion of the seventh gate electrode GE7, in reference to the plan view of FIG. 9.

The seventh contact electrode CT7 is extended from the seventh drain electrode DE7, and overlaps a portion of with the seventh pixel electrode PE7. The seventh contact electrode CT7 may be connected to the seventh pixel electrode PE7 via a seventh contact hole H7. The seventh contact electrode CT7 may overlap with a portion of the second pixel electrode PE 2 and a portion of the third pixel electrode PE3.

The second switching part includes a fourth switching element SW4, a fifth switching element SW5, a sixth switching element SW6, and an eighth switching element SW8. The second contact part includes a fourth contact electrode CT4, a fifth contact electrode CT5, a sixth contact electrode CT6, and an eighth contact electrode CT8.

The fourth switching element SW4, the fifth switching element SW5, the sixth switching element SW6, and the eighth switching element SW8 may be similar to the first switching element SW15, the second switching element SW2, the third switching element SW3, the switching element SW4, respectively. Further, the fourth contact electrode CT4, the fifth contact electrode CT5, the sixth contact electrode CT6, and the eighth contact electrode CT8 may be similar to the first contact electrode CT1, the second contact electrode CT2, the third contact electrode CT3, and the seventh contact electrode CT7. Accordingly, repetitive explanation concerning above elements will be omitted.

The first pixel electrode PE1, the second pixel electrode PE2, the third pixel electrode PE3, the fourth pixel electrode PE4, the fifth pixel electrode PE5, the sixth pixel electrode PE6, the seventh pixel electrode PE7, and the eighth pixel electrode PE8 correspond to at least four color filters. The color filters may include at least four colors selected from a color group, which may include colors of red, green, blue, cyan, magenta, yellow and white.

According exemplary embodiments of the invention, the first pixel electrode PE1, the second pixel electrode PE2, the third pixel electrode PE3, and the seventh pixel electrode PE7 of the first pixel electrode part PEP15 may be connected to one data line DL, so that the number of the data lines may decrease. Thus, the number of source drivers connected to the data lines may decrease, so that the manufacturing cost may be reduced.

In addition, as the number of the data lines decreases, a light blocking area on which the conventional data lines are disposed may be reduced. Thus, the aperture ratio may increase.

According to exemplary embodiments of the present invention, a plurality of gate lines connected to a plurality of pixel electrodes may be concentrically disposed in a first wiring area, so that an aperture ratio may increase.

In addition, the gate lines connected to a first pixel electrode, a second pixel electrode, and a third pixel electrode may be concentrically disposed in the first wiring area, so that the aperture ratio may be increased.

In addition, the first wiring area is disposed between a first pixel electrode part and a second pixel electrode part. The first pixel electrode part may include the first pixel electrode, the second pixel electrode, and the third pixel electrode. The second pixel electrode part may include a fourth pixel electrode, a fifth pixel electrode, and a sixth pixel electrode. The second pixel electrode part may be spaced apart from the first pixel electrode part in a first direction which a data line extends in. A width of the first wiring area may be increased, so that likelihood of crosstalk of a stereoscopic image display panel may be reduced.

The foregoing is illustrative of the present invention and is not to be construed as limiting thereof. Although various exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present disclosure. Therefore, it is to be understood that the foregoing is illustrative of the present invention and is not to be construed as limited to the exemplary embodiments disclosed, and that modifications to the disclosed exemplary embodiments, as well as other embodiments, are intended to be included within the scope of the appended claims and their equivalents.

What is claimed is:

1. A stereoscopic image display substrate comprising:
   a base substrate;
   a data line disposed on the base substrate, the data line extending in a first direction;
   a plurality of gate line parts disposed on the base substrate, each gate line part including a plurality of gate lines extending in a second direction different from the first direction, the gate lines being adjacent to each other; and
   a pixel electrode part disposed between the gate line parts, the pixel electrode part including at least three pixel electrodes connected to the data line.

2. The stereoscopic image display substrate of claim 1, wherein the gate line parts comprises a first gate line part and a second gate line part, and the plurality of gate lines of the first gate line part are adjacent to each other, and the plurality of gate lines of the second gate line part are adjacent to each other.

3. The stereoscopic image display substrate of claim 1, wherein the gate line parts comprises a first gate line part and a second gate line part, and the first gate line part is disposed adjacent to a first side of the pixel electrode part, and
   wherein the second gate line part is disposed adjacent to a second side of the pixel electrode part.

4. The stereoscopic image display substrate of claim 1, wherein each of the pixel electrodes comprises a width in the first direction and a length in the second direction, the length being greater than the width.

5. The stereoscopic image display substrate of claim 1, wherein the gate line parts comprises a first gate line part and a second gate line part, and the first gate line part comprises a first gate line, a second gate line, and a third gate line; and
   the second gate line part comprises a fourth gate line, a fifth gate line, and a sixth gate line.

6. The stereoscopic image display substrate of claim 5, wherein the pixel electrode part includes a first pixel electrode, a second pixel electrode, and a third pixel electrode,
   and wherein the stereoscopic image display substrate further comprises:
   a first switching element comprising a first gate electrode extended from one of the gate lines of the first gate line part or the second gate line part, a first source electrode extended from the data line, and a first drain electrode spaced apart from the first source electrode and connected to the first pixel electrode;
   a second switching element comprising a second gate electrode extended from one of the gate lines of the first gate line part or the second gate line part, a second source electrode extended from the data line, and a second drain electrode spaced apart from the second source electrode and connected to the second pixel electrode; and
   a third switching element comprising a third gate electrode extended from one of the gate lines of the first gate line part or the second gate line part, a third source electrode extended from the data line, and a third drain electrode spaced apart from the third source electrode and connected to the third pixel electrode.

7. The stereoscopic image display substrate of claim 6, further comprising:
   a first contact part comprising a first contact electrode extended from the first pixel electrode and connected to the first drain electrode;
   a second contact part comprising a second contact electrode extended from the second pixel electrode and connected to the second drain electrode; and
   a third contact part comprising a third contact electrode extended from the third pixel electrode and connected to the third drain electrode.

8. The stereoscopic image display substrate of claim 7, wherein the first contact part is disposed adjacent to the first gate line part, the second contact part is disposed adjacent to the second gate line part, and the third contact part is disposed adjacent to the second gate line part.

9. The stereoscopic image display substrate of claim 7, wherein the third contact part is disposed between the fourth gate line and the fifth gate line.

10. The stereoscopic image display substrate of claim 7, wherein the second contact part is disposed between the fourth gate line and the fifth gate line, and the first contact part is disposed between the fifth gate line and the sixth gate line.

11. The stereoscopic image display substrate of claim 1, wherein the gate line parts comprises a first gate line part and a second gate line part, and the pixel electrode part includes a first pixel electrode, a second pixel electrode, and a third pixel electrode,
    and wherein gate lines of one of the first gate line parts and the second gate line parts are connected to the first pixel electrode, the second pixel electrode, and the third pixel electrode.

12. The stereoscopic image display substrate of claim 1, wherein the pixel electrode part includes a first pixel electrode, a second pixel electrode, and a third pixel electrode, and the first pixel electrode, the second pixel electrode, and the third pixel electrode are disposed in the second direction.

13. The stereoscopic image display substrate of claim 1, wherein the pixel electrode part includes a first pixel electrode, a second pixel electrode, and a third pixel electrode, and the first pixel electrode, the second pixel electrode, and the third pixel electrode are disposed in the first direction.

14. A stereoscopic image display panel, comprising:
    a display panel, comprising:
       a first substrate comprising a base substrate, a data line, a plurality of gate line parts and a plurality of pixel electrode parts, the data line being disposed on the base substrate and extended in a first direction, each gate line part comprising a plurality of gate lines, the gate lines extending in a second direction and disposed adjacently to each other, each pixel electrode part being disposed between adjacent gate line parts and comprising at least three pixel electrodes connected to the data line; and
       a second substrate facing the first substrate; and
    a retarder disposed on the display panel, the retarder comprising a first pattern portion and a second pattern portion alternately corresponding to the pixel electrode parts.

15. The stereoscopic image display panel of claim 14, wherein
    an odd row pixel electrode part of the pixel electrode parts disposed in the first direction corresponds to the first pattern portion, and
    an even row pixel electrode part of the pixel electrode parts disposed in the first direction corresponds to the second pattern portion.

16. The stereoscopic image display panel of claim 14, wherein at least one of the pixel electrodes of the pixel electrode parts has a width in the first direction and a length in the second direction, the length being greater than the width.

17. A stereoscopic image display system, comprising:
a stereoscopic image display panel, comprising:
- a display panel comprising a first substrate and a second substrate facing the first substrate,
  the first substrate comprising a base substrate, a data line, a plurality of gate line parts and a plurality of pixel electrode parts, the data line being disposed on the base substrate and extended in a first direction, each gate line part comprising a plurality of gate lines extended in a second direction and disposed adjacently to each other, each pixel electrode part being disposed between adjacent gate line parts and comprising at least three pixel electrodes connected to the data line; and
- a retarder disposed on the display panel, the retarder comprising a first pattern portion and a second pattern portion alternately corresponding to the pixel electrode parts; and
a pair of polarizing glasses comprising a first glass lens and a second glass lens, the first glass lens configured to transmit an image comprising the first patterned portion, the second glass lens configured to transmit an image comprising the second patterned portion.

18. The stereoscopic image display system of claim 17, wherein one of the pixel electrodes corresponds to a color filter, the color filter configured to emit light of at least one of red, green, blue, cyan, magenta, yellow, and white colors.

19. The stereoscopic image display system of claim 17, further comprising:
- an odd row pixel electrode part of the pixel electrode parts disposed in the first direction corresponds to the first pattern portion, and
- an even row pixel electrode part of the pixel electrode parts disposed in the first direction corresponds to the second pattern portion.

20. The stereoscopic image display system of claim 17, wherein the first pattern portion comprises a first slow phase axis, and the second pattern portion comprises a second slow phase axis.

21. The stereoscopic image display system of claim 20, wherein light comprising the first pattern portion is viewed through the first glass lens, and light comprising the second pattern portion is viewed through the second glass lens.

* * * * *